March 12, 1957 C. T. GODDARD 2,785,339

WAVE AMPLIFIER ELECTRON DISCHARGE DEVICE

Filed Oct. 17, 1952 2 Sheets-Sheet 1

INVENTOR
C. T. GODDARD
BY
[signature]
ATTORNEY

March 12, 1957 C. T. GODDARD 2,785,339

WAVE AMPLIFIER ELECTRON DISCHARGE DEVICE

Filed Oct. 17, 1952 2 Sheets-Sheet 2

INVENTOR
C. T. GODDARD
BY
[signature]
ATTORNEY

United States Patent Office 2,785,339

Patented Mar. 12, 1957

2,785,339

WAVE AMPLIFIER ELECTRON DISCHARGE DEVICE

Charles T. Goddard, Basking Ridge, N. J., assignor to Bell Telephone Laboratories, Incorporated, New York, N. Y., a corporation of New York Application October 17, 1952, Serial No. 315,281

19 Claims. (Cl. 315—39)

This invention relates to electron discharge devices and more particularly to such devices especially suitable for use as broad band wave amplifiers.

For various applications it is desirable to be able to obtain a high degree of amplification over a broad band of frequencies. Present circuit needs look for an increase in both the breadth of the band of frequencies and the gain or amplification attainable. A number of proposals have been made to increase the frequency band while increasing, or at least not diminishing, the amplification. One such proposal has been to employ a number of electron discharge devices in a delay line together with inductances, capacitances, and interconnecting leads to form an amplifier circuit. Such amplifier circuits, however, are subject to several disadvantages. One such disadvantage is that the stray capacitances associated with the sockets of the individual devices of the circuit and with the wiring of the circuit adversely affect the circuit's performance by reducing the cut-off frequency, thereby decreasing the bandwidth, and/or by limiting the gain attainable, the bandwdith and the gain being interdependent. These stray capacitances necessarily present in an amplifier circuit composed of a number of distinct discharge devices and interconnecting leads thereby prevent the attainment of the two desiderata of a wide frequency band and high gain.

Additionally the unavoidable reactances due to the individual cathode leads that extend through the envelopes of the various distinct devices to ground and in the screen lead of each of the devices constitute feedback paths which prevent satisfactory operation of such an amplifier circuit above about 200 megacycles and thus also limit the band of the amplifier. Further to decrease the effects of these stray capacitances on the performance of the circuit, the interelectrode capacitance must be made large with respect to the stray capacitances. This requires large cathode areas and consequently a high power consumption. Thus the power consumption of the circuit as a whole is generally quite high. This prohibits the employment of very small discharge devices in the circuit, making it cumbersome, expensive, and requiring large cooperating components.

It is an object of this invention to provide an improved broad band wave amplifier. More specifically it is an object of this invention to position all of the elements of a wave amplifier facilely in a single electron discharge device.

It is a further object of this invention to decrease the power consumption of a wave amplifier. Thus it is an object of this invention to limit the stray capacitances associated with a wave amplifier and to prevent their disadvantageously affecting the amplifier.

It is a further object of this invention to provide an amplifier capable of amplifying a broad band of frequencies at a high gain.

Further it is an object of this invention to provide an amplifier electron discharge device having low noise characteristics.

It is a still further object of this invention to provide an improved transmission or delay line element that may be employed in wave amplifier electron discharge devices.

It is a still further object of this invention to facilely and simply mount all of the elements of a wave amplifier within a single electron discharge device, the active and passive elements being mounted in a simple compact unitary assembly.

These and other objects of this invention are attained in accordance with certain features of this invention by the provision within the envelope of a single electron discharge device of two transmission lines. The one transmission line comprises the input or control grid portion of the electron discharge device and the other transmission line the output or anode portion of the device. The input transmission line comprises a single cathode and a plurality of isolated control grid sections directly adjacent the cathode, the control grid sections being joined by lumped impedances.

In accordance with one feature of this invention, the control grid portions are each a plurality of fine wires extending across a channelled frame member in which is positioned the cathode, and a single turn of wire is embedded into the back of the frame member and joins successive control grid portions. The output transmission line similarly comprises a plurality of isolated anode sections which may advantageously be across another channelled member in which a ground plate or dummy cathode is positioned, single turns of wire being also embedded in the back of this frame member and joining successive anode sections. These two transmission lines are separated by a screen grid which isolates them from each other so that the only coupling between them is that of the various electron streams of the tetrode elements defined by aligned control grid sections, anode sections, and the portions of the cathode and screen grid aligned therewith.

The two transmission lines are so terminated that their impedance levels remain substantially constant over the desired wide frequency range of amplification. The impedance level and the bandwidth are essentially independent of the length of the transmission lines. By fabricating the two transmission lines of the same parts and employing a dummy cathode positioned behind the anode sections the same distance that the cathode is positioned behind the control grid sections, the impedance levels of the two transmission lines may advantageously be the same. However, by making the impedance level of the output transmission line higher than that of the input transmission line a higher gain is attainable.

The impedances which join successive control grid sections and successive anode sections, together with the associated capacitances to the cathode, dummy cathode, and screen grid are chosen to provide a pair of transmission lines of like phase velocity so that the input wave, which is applied to the control grid and the cathode of the input transmission line can control the electron stream of each of the individual tetrode elements of the device in proper phase relationship with the output wave which is coupled thereto by these electron streams.

It is therefore a feature of this invention that an electron discharge device comprise a pair of transmission lines, the one transmission line comprising a common cathode and discrete control grid sections connected by passive reactances and the other transmission line comprising discrete anode sections connected by passive reactances, the two transmission lines being separate and isolated from each other by a screen grid.

It is a further feature of this invention that each of these discrete control grid elements be aligned with one of the anode elements and together with the portions of the common cathode and screen grid aligned therewith comprise a tetrode electron discharge device element, the electron streams of these tetrode elements providing the only coupling between the input and output transmission lines of the device.

It is a further feature of this invention that the transmission line comprise a channelled frame member in which a cathode may be positioned and across which a number of electrode sections may extend, successive sections being connected by a single turn of wire embedded in the back of the channelled frame member and defining the lumped impedance of the transmission line.

It is a further feature of this invention that an electron discharge device comprise a pair of such transmission lines mounted together in a sandwich assembly with the screen grid interposed between, a pin extending through the channelled frames and associated members to lock them together in a compact unitary assembly.

It is a further feature of this invention that the input and output transmission lines be of equal phase velocity but that they may be of either equal or unequal impedance levels. Thus it is a feature of one embodiment of the invention that the transmission lines be fabricated of identically dimensioned parts whereby the construction and assembling of the device is simplified and the transmission lines are of equal impedance levels. And it is a feature of another embodiment of this invention that the impedance level of the output transmission line be higher than that of the input transmission line whereby a higher gain is realizable.

A complete understanding of this invention and of these and various other desirable features thereof may be gained from consideration of the following detailed description and the accompanying drawing, in which.

Figure 1:
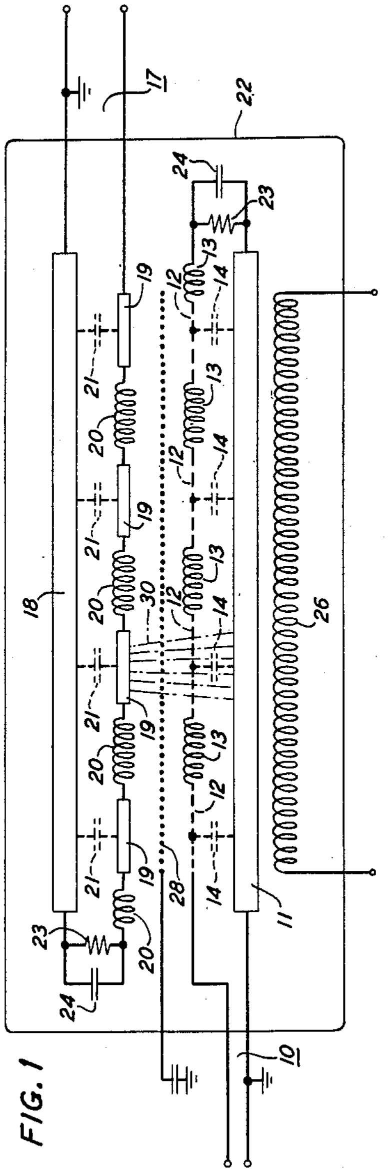
Fig. 1 is a schematic representation of an electron discharge device in accordance with one specific illustrative embodiment of this invention.

Referring now to the drawing, Fig. 1 is a schematic representation of a wave amplifier tetrode in accordance with a specific illustrative embodiment of this invention. The wave amplifier tetrode comprises an input transmission line 10, comprising the cathode 11, control grid section 12, intervening inductances 13, and distributed capacitances 14, and an output transmission line 17 comprising a ground member 18, anode sections 19, intervening inductances 20, and distributed capacitances 21 enclosed within an envelope 22. Each transmission line 10 and 17 is terminated in a resistance 23 and capacitance 24. A heater element 26 is positioned adjacent the cathode 11. The two transmission lines are separated by a grounded screen grid 28 so that the only communication between the two transmission lines is provided by the electron streams 30, of which only one is shown in the drawing, of each of the tetrode elements comprising an anode section 19, the screen grid 28, a control grid section 12, and the portion of the cathode 11 directly adjacent thereto.

An electromagnetic wave is applied to the input transmission line 10 and travels down the transmission line exciting successive control grids 12 by the voltage existing between the control grid 12 at that point in the wave and the cathode 11. As the grid is thus energized by the input wave it controls the electron stream 30 which forms the sole communication with the output transmission line 17.

The input wave travels down the length of the transmission line 10 thus affecting the successive electron streams 30 until it is absorbed in the terminating elements comprising the resistor 23 and capacitor 24.

Due to the flow of electrons from the input transmission line 10 to the output transmission line 17 current will flow along the anode sections 19 and an output wave is thus generated in the output transmission line 17. This current will flow in both directions from any particular electron discharge device element, i. e., from any particular anode element of the device elements, but the backward components of the waves are absorbed by the terminating network comprising the resistor 23 and capacitor 24. By so choosing the impedances 13 and 20 that the phase velocity of the two transmission lines 10 and 17 is the same, the energy delivered to the output wave by each successive electron discharge device element due to the input wave will be in phase with the output wave being generated so that the energies add up and the output wave or the voltage appearing at the output of the output transmission line is due to the sum of these separate device elements.

Figures 4, 5:
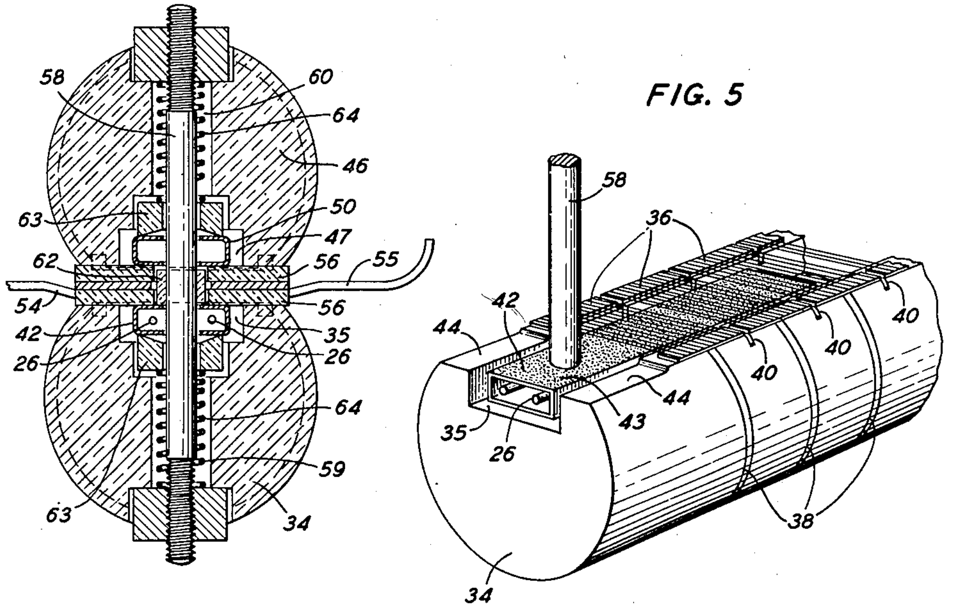
Fig. 4 is a sectional view along the line 4—4 of Fig. 2.
Fig. 5 is a perspective view of a portion of the input transmission line of the device of Fig. 2 showing particularly the cathode, channelled frame member, control grid sections, and single turn wires joining successive control grid sections.

Referring now to Figs. 2 through 5, in the specific illustrative embodiment of this invention there depicted, the input transmission line 10 comprises a ceramic cylinder 34 having one surface flattened and having a channel or groove 35 in that surface. As best seen in Fig. 5 the control grid portions 12 each comprise a plurality of wires 36 extending across the groove 35 and sealed to the side portions of the cylinder 34 and the intervening inductances 13 each comprise a single turn of metal 38 extending from one side of one group of wires 36 to the other side of the next group of wires 36, the single turn 38 being embedded in the back of the ceramic cylinder 34. Advantageously these inductances are formed by cutting a series of single grooves in the back of the ceramic, metallizing the back surface, and then grinding off the metallized coating so that the surface again appears but the grooves, of course, remain metallized. Also advantageously the individual control grids 12, which each comprises a plurality of wires 36 extending across the channel 35, are separated from each other by slight cuts 40 in the flat surface of the ceramic cylinder 34. The fabrication of the control grids and the ceramic cylinder are advantageously as disclosed in my application Serial No. 315,282, filed October 17, 1952.

The output transmission line 17 comprises another ceramic cylinder 46 having a groove 47 in its flattened surface identical with the ceramic cylinder 34. A dummy flat tubular cathode 50, defining the ground member 18, i spositioned in the groove 47, the dummy cathode 50 being identical with the cathode 42 but not having an emissive coating thereon. The anodes 19 may comprise either a plurality of wires or flat plates 51, best seen in Fig. 3, extending across the groove, the wires or plates comprising the anodes 19 being connected by individual single turns of metal 52 in the cylinder 46 identical with the turns 38 and defining the inductances 20.

Figure 2:
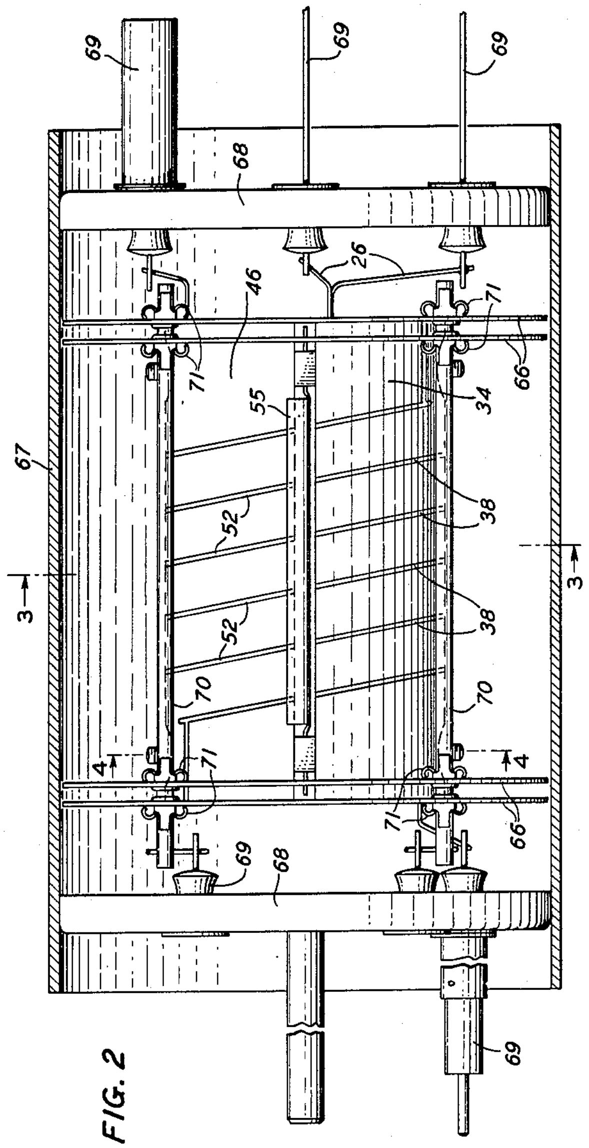
Fig. 2 is a side view of a specific embodiment of the invention in accordance with Fig. 1, a portion of the envelope being shown in section.
Figure 3:
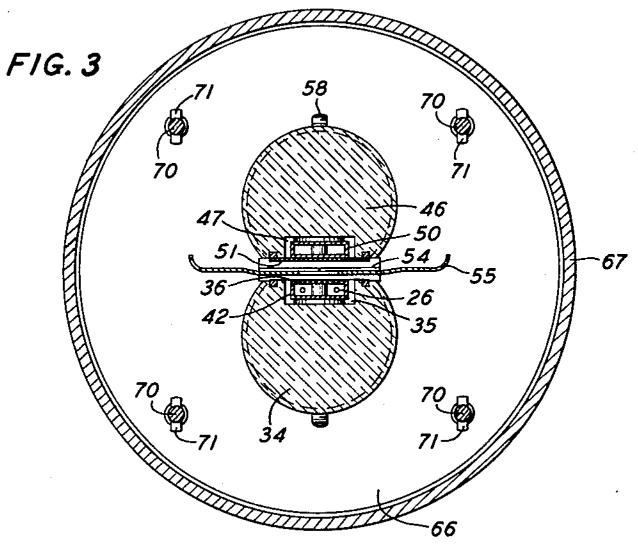
Fig. 3 is a sectional view along the line 3—3 of Fig. 2.

The two ceramic cylinders 34 and 36 are mounted together in a sandwich construction with a screen grid frame 54 interposed between them and supporting the grounded screen grid 28. Advantageously the screen grid frame 54 has side extensions 55 extending out from the various elements of the device to effectively shield the two transmission lines from any stray fields that may be in the vicinity of either of them and thus to prevent coupling between the transmission lines due to such stray fields of either line. The screen grid frame 54 is insulated from the transmission lines by end insulator members 56, best seen in Fig. 4, which rest on the stepped end portions 44 of the ceramic cylinders 34 and 46 and against which the cathode 42 and dummy cathode 50 are spring biased, as further disclosed in my Patent 2,663,819, issued December 22, 1953. A metallic pin 58 advantageously extends through apertures 59 and 60 in each end of each of the ceramic cylinders 34 and 46 respectively, as best seen in Fig. 4, and through mating apertures in the cathode 42, dummy cathode 50, insulator members 56 and screen grid frame 54. An insulator bushing 62 encompasses the pin 58 adjacent the insulator members 56 and a pair of insulator washers 63 are positioned on the pin to opposite sides of the cathode 42 and dummy cathode 50 and are spring biased thereagainst by a pair of springs 64 held in position by nuts 65 threadedly attached to the ends of the pin 58, the springs 64 maintaining the cathode 42 and dummy cathode 50 against the insulator members 56 and thus in the plane of the stepped end portions 44 which define the spacing between the cathode 42 and the control grids 12 and the dummy cathode 50 and the anodes 19. By means of the pins 58 the two transmission lines are assembled in a small compact unit that may readily be supported, as by mica discs 66 within the envelope 22 which may comprise a cylinder 67, preferably of metal, having end members 68 with terminal leads 69 sealed therein and extending therethrough, as best seen in Fig. 2. The mica discs 66 may be supported by a plurality of posts 70 to which they are secured by eyelets 71, the posts 70 being secured to certain of the terminals 69. The terminating resistors 23 and capacitors 24 may advantageously be mounted within the envelope 22 of the device by being mounted on certain of the posts 70 or may be circuit elements external to the envelope of the device and connected thereto through terminals 69.

The lumped and distributed impedances of the two transmission lines 10 and 17, and particularly the inductances 13 and 20 and capacitances 14 and 21, are so chosen and determined that the two transmission lines are of like phase velocity so that the input wave traveling along the input transmission line 10 is in phase with the output wave traveling along the output transmission line 17 to which it is coupled by the electron streams 30 of the various tetrode sections of the tetrode wave amplifier. The gain possible of the output wave over the input wave is dependent both on the transconductance of these tetrode sections, for which reason it is desirable that the control grid sections 12 be closely spaced to the cathode 11, and the relative impedance levels of the two lines. To further increase the gain the distributed capacitances 21 of the output transmission line 17 could be made considerably smaller than the distributed capacitances 14 of the input transmission line 10 thereby making the impedance level of the output line 17 much larger than the impedance level of the input transmission line 10. In the specific embodiment disclosed in Figs. 2 through 5 the input and output capacitances are maintained the same due to the positioning of the ground plate 18, which is the dummy cathode 50, within the ceramic cylinder 46 adjacent the anode sections 19, the ground plate 18 being positioned in the same manner as the cathode 11 and also dimensionally positioned the same. However, the ground plate 18 could be positioned considerably further from the anode sections 19 than the cathode 11 from the control grid section 12, or it could be omitted and either the anode section to screen grid capacitance used as the capacitance of the output transmission line 17 or additional capacitance added to obtain transmission lines of equal phase velocity but properly unequal impedance levels.

As the control grid portions 12 are closely adjacent the common cathode 11, the elemental electron discharge devices defined by the grid and anode elements all have high transconductances whereby a high gain and low noise characteristics are attainable.

Reference is made to my application Serial No. 315,283, filed October 17, 1952 wherein a related invention is described.

It is to be understood that the above-described arrangements are illustrative of the application of the principles of the invention. Numerous other arrangements may be devised by those skilled in the art without departing from the spirit and scope of the invention.

What is claimed is:

1. An electron discharge device comprising an envelope, an input transmission line extending into said envelope and comprising within said envelope a cathode, a support member, a plurality of distinct control grid elements supported by said support member adjacent said cathode, and impedance means connecting successive control grid elements, an output transmission line extending into said envelope and comprising within said envelope a plurality of distinct anode elements, each of said anode elements being opposite to and aligned with a respective one of said control grid elements, and impedance means connecting successive anode elements, and a screen within said envelope between said control grid elements and said anode elements and isolating said transmission lines from each other.

2. An electron discharge device in accordance with claim 1 wherein each of said transmission lines has the same phase velocity but the impedance level of said output transmission line is higher than the impedance level of said input transmission line.

3. An electron discharge device comprising an envelope, an input transmission line extending into said envelope and comprising within said envelope a plurality of control grid elements, impedance means connecting successive control grid elements, and a cathode common and adjacent to all of said control grid elements, an output transmission line extending into said envelope and comprising within said envelope a plurality of anode elements and impedance means connecting successive anode elements, and a screen grid positioned between said anode elements and said control grid elements and isolating said input and output transmission lines from each other.

4. A tetrode wave amplifier device comprising an envelope, a pair of transmission lines within said envelope, the first of said lines comprising a common cathode, a plurality of control grid elements each closely adjacent said cathode, and impedance means connecting said control grid elements and the second of said lines comprising a plurality of anode elements and impedance means connecting said anode elements, said transmission lines being of the same phase velocity, and a screen grid positioned between said transmission lines, each of said control grid elements and anode elements together with the portions of said cathode and screen grid aligned therewith defining an electron discharge device element.

5. A tetrode wave amplifier device comprising an envelope, an input transmission line extending into said envelope and comprising within said envelope a cathode, a support member, a plurality of distinct control grid elements supported by said support member closely adjacent said cathode, and impedance means connecting each of said control grid elements, an output transmission line extending into said envelope and comprising within said envelope a plurality of distinct anode elements, each of said anode elements being opposite to and aligned with one of said control grid elements, and impedance means connecting each of said anode elements, and a screen grid within said envelope between said transmission line and electrically shielding said lines from each other, each of said control grid elements, anode elements and portions of said cathode and screen grid aligned therewith comprising an electron discharge device element and the electron streams of said discharge device elements being the only coupling between said transmission lines.

6. A tetrode wave amplifier in accordance with claim 5 wherein said transmission lines are of equal phase velocity but the impedance level of said output transmission line is higher than the impedance level of said input transmission line.

7. A tetrode wave amplifier device comprising an envelope, an input transmission line extending into said envelope and comprising within said envelope a cathode, a first support member, a plurality of electrically distinct control grid elements supported by said first member closely adjacent said cathode, and impedance means connecting each of said control grid elements, said impedance means being also supported by said first support, an output transmission line extending into said envelope and comprising within said envelope a second support member, a plurality of electrically distinct anode elements supported by said second support member, each of said anode elements being opposite to and aligned with one of said control grid elements, and impedance means connecting each of said anode elements, said impedance means supported by said second support member, and a screen grid within said envelope and between said transmission lines whereby said lines are shielded from each other, each of said control grid elements, anode elements, and the portions of said cathode and screen grid aligned therewith comprising a tetrode electron discharge device element and the electron streams of said discharge device elements being the only coupling between said transmission lines.

8. A wave amplifier electron discharge device comprising a pair of channelled insulator frames, a plurality of discrete sections of fine wire across one of said frames and defining control grid sections, a cathode positioned in said one frame closely adjacent said control grid sections, a plurality of anode sections across the other of said frames, a ground plate positioned in said other frame adjacent said anode sections, conducting means embedded in each of said frames connecting successive sections and defining a lumped impedance therebetween, and a screen grid between said frames and isolating said control grid sections and cathode from said anode sections and said ground plate.

9. A wave amplifier electron discharge device comprising a pair of channelled insulator frames, a plurality of discrete sections of fine wire across one of said frames and defining control grid sections, a cathode positioned in said one frame closely adjacent said control grid sections, a plurality of anode sections across the other of said frames, a single turn of wire embedded in each of said frames connecting successive sections and defining a lumped impedance therebetween, a screen grid frame between said insulator frames having side portions extending out from said frames and a plurality of fine wires across said screen grid frame to isolate said control grid sections, said lumped impedances therebetween and said cathode from said anode sections and said lumped impedances therebetween.

10. A wave amplifier electron discharge device comprising an envelope, a pair of channelled ceramic frames within said envelope, a plurality of discrete sections of fine wire across one of said frames and defining control grid sections, a cathode positioned in the channel of said one frame closely adjacent said control grid sections, a plurality of anode sections across the other of said frames, a conducting plate positioned in the channel of said other frame adjacent said anode sections, a single turn of wire embedded in the back of each of said frames and connecting successive control grid and anode sections, said turns of wire defining lumped impedances between said sections, a screen grid between said frames and isolating said control grid sections and said cathode from said anode sections and said conducting plate, each of said control grid sections and anode sections together with the portions of said cathode and screen grid aligned therewith defining an electron discharge device element.

11. A transmission line for electromagnetic wave energy comprising a channeled insulator member, a conducting member within said channel, a plurality of wires extending across the front of said channel between opposite sides thereof, said wires being remote from the bottom of said channel and being separated into distinct sections, and a plurality of single wires embedded in the back of said insulator member and extending only between said sides, said single wires joining each section of wires at one side of said insulator member to the succeeding section of wires at the opposite side of said insulator member.

12. A transmission line for electromagnetic wave energy comprising a channeled insulator member, a conducting member within said channel, a plurality of discrete conducting sections extending across said channel between opposite sides thereof, said sections being remote from the bottom of said channel, and conducting means embedded in the back of said insulator member, extending between said sides, and joining each conducting section at one side of said insulator member to the succeeding conducting section at the other side of said insulator member.

13. A transmission line for an electron discharge device comprising a channeled insulator member, a conducting member within said channel, a plurality of discrete conducting sections extending across said channel between opposite sides thereof and remote from the bottom of said channel and conducting means embedded in the back of said insulation member between said sides, said conducting means joining each conducting section at one side of said insulator member to the succeeding conducting section at the other side of said insulator member.

14. A transmission line for an electron discharge device comprising a channeled ceramic member, a cathode in said channel, a number of discrete grid elements across said channel between opposite sides thereof, a plurality of single wires embedded in the back of said ceramic member, said wires joining each grid element at one side of said ceramic member to the succeeding grid element at the other side of said ceramic member, and means positioning said cathode closely adjacent said grid elements in said channel.

15. An electron discharge device comprising an envelope, a pair of channelled ceramic frames within said envelope, a plurality of discrete electrode elements across each of said frames, a conducting member situated within the channel of each of said frames adjacent the electrode elements thereacross, a single turn of wire embedded in the back of each of said frames and connecting successive electrode elements, said turns of wire defining lumped impedances between said elements, a screen grid between said frames and isolating one of said conducting members and said electrode elements adjacent thereto from the other of said conducting members and said electrode elements adjacent thereto, insulating members positioning said screen grid between said frames, a pin extending through each of said frames, spring means encompassing said pins for positioning said conducting members adjacent said electrode elements, and means including said pins locking said frames, insulator members, and screen grid in a compact unitary assembly.

16. An electron discharge device comprising an envelope, a pair of channelled ceramic frames within said envelope, a plurality of discrete electrode elements across each of said frames, a conducting member situated within the channel of each of said frames adjacent the electrode elements thereacross, conducting means embedded in the back of each of said frames and connecting successive electrode elements, said conducting means defining lumped impedances between said electrode elements, a screen grid frame between said channelled ceramic frames and comprising side portions extending out between said ceramic frames and a plurality of fine wires across said screen grid frame for isolating one of said conducting members and the electrode elements adjacent thereto from the other of said conducting members and electrode elements adjacent thereto, an electron emissive surface on one of said conducting members, a heater element adjacent said emissive surface, and means for locking said channel frames, screen grid frame, and conducting members in a compact unitary assembly and for insulating said screen grid frame from said electrode elements.

17. An electron discharge device comprising an envelope, a first channelled ceramic frame within said envelope, a plurality of discrete wire elements across said frame and defining control grid elements, a cathode situated within said frame adjacent said control grid elements, single turns of wire embedded in the back of said frame connecting successive control grid elements and defining lumped impedances between said elements, a second channelled ceramic frame within said envelope, a plurality of anode elements across said second frame, a conducting plate situated within said second frame adjacent said anode elements, single turns of wire embedded in the back of said second frame connecting successive anode elements and defining lumped impedances between said elements, a screen grid between said frames and isolating said control grid elements and said cathode from said anode elements and said conducting plate, insulating members positioning said screen grid between said frames, a pin extending through each of said frames at each end thereof, spring means encompassing said pins for positioning said cathode closely adjacent said control grid elements, means including said pins locking said frames, insulator members, and screen grid in a compact unitary assembly, and means supporting said assembly within said envelope, each of said anode elements, control grid elements and portions of said cathode and screen grid aligned therewith comprising a distinct discharge device element and the electron streams of said discharge device elements being the only coupling between said transmission lines.

18. A wave amplifier electron discharge device comprising an envelope, an input transmission line extending through said envelope and comprising a first channelled ceramic frame within said envelope, a plurality of discrete sections of fine wire across said frame and defining control grid sections, a cathode positioned in the channel of said first frame closely adjacent said control grid sections and a single turn of wire embedded in the back of said first frame and connecting successive control grid sections, said turns of wire defining lumped impedances between said sections, an output transmission line extending through said envelope and comprising a second channelled ceramic frame within said envelope, a plurality of anode sections across said second frame, a conducting plate positioned in the channel of said second frame adjacent said anode sections and a single turn of wire embedded in the back of said second frame and connecting successive anode sections, said second mentioned single turns of wire defining lumped impedances between said anode sections, and a screen grid between said frames and isolating said input transmission line from said output transmission line, each of said control grid sections and anode sections together with the portions of said cathode and screen grid aligned therewith defining an electron discharge device element and the electron streams of said electron discharge device elements being the only coupling between said transmission lines.

19. A wave amplifier electron discharge device in accordance with claim 18 wherein the impedance level of said output transmission line is higher than the impedance level of said input transmission line.

References Cited in the file of this patent

UNITED STATES PATENTS

| | | |
|---|---|---|
| 2,109,843 | Kassner | Mar. 1, 1938 |
| 2,122,538 | Potter | July 5, 1938 |
| 2,128,232 | Dallenbach | Aug. 30, 1938 |
| 2,595,677 | Law | May 6, 1952 |
| 2,611,101 | Wallauschek | Sept. 16, 1952 |
| 2,647,175 | Sheer | July 28, 1953 |
| 2,707,759 | Pierce | May 3, 1955 |

FOREIGN PATENTS

| | | |
|---|---|---|
| 985,536 | France | Mar. 14, 1951 |